United States Patent
Tzou et al.

(10) Patent No.: US 8,329,315 B2
(45) Date of Patent: Dec. 11, 2012

(54) ULTRA THIN COPPER FOIL WITH VERY LOW PROFILE COPPER FOIL AS CARRIER AND ITS MANUFACTURING METHOD

(75) Inventors: Ming Jen Tzou, Taipei County (TW); Ya Mei Lin, Taipei County (TW)

(73) Assignee: Nan Ya Plastics Corporation, Taipei (TW)

( * ) Notice: Subject to any disclaimer, the term of this patent is extended or adjusted under 35 U.S.C. 154(b) by 0 days.

(21) Appl. No.: 13/017,343

(22) Filed: Jan. 31, 2011

(65) Prior Publication Data

US 2012/0196144 A1  Aug. 2, 2012

(51) Int. Cl.
- *B32B 15/01* (2006.01)
- *B32B 15/04* (2006.01)
- *C25D 5/10* (2006.01)

(52) U.S. Cl. ........ 428/674; 428/606; 428/607; 428/660; 428/671; 428/458; 205/170; 205/176; 205/178; 205/182; 205/183; 205/291

(58) Field of Classification Search .......... 428/606–680, 428/458; 205/170, 176, 178, 182, 183, 291
See application file for complete search history.

(56) References Cited

U.S. PATENT DOCUMENTS

| | | | | |
|---|---|---|---|---|
| 3,998,601 | A | * | 12/1976 | Yates et al. ............. 428/607 |
| 4,503,112 | A | * | 3/1985 | Konicek ............. 428/216 |
| 5,622,782 | A | * | 4/1997 | Poutasse et al. ............. 428/344 |
| 6,346,335 | B1 | * | 2/2002 | Chen et al. ............. 428/629 |
| 6,689,268 | B2 | * | 2/2004 | Chen et al. ............. 205/171 |
| 7,049,007 | B2 | * | 5/2006 | Gales et al. ............. 428/607 |
| 7,175,920 | B2 | * | 2/2007 | Suzuki et al. ............. 428/615 |
| 7,771,841 | B2 | * | 8/2010 | Suzuki et al. ............. 428/675 |

* cited by examiner

*Primary Examiner* — Cathy Lam
(74) *Attorney, Agent, or Firm* — Ming Chow; Sinorica, LLC

(57) ABSTRACT

The present invention relates to an ultra thin copper foil with a very low profile copper foil as a carrier, comprising a carrier foil、a release layer and an ultra thin copper foil. The copper foil with the Very Low Profile, smooth on both sides (i.e. VLP copper foil) is used as the carrier foil, the said very low profile copper foil for supporting the ultra thin copper foil can bring advantages of no pinhole, excellent thickness uniformity and low surface roughness. The impact of a release layer on the bond strength between the carrier foil and the ultra thin copper foil is very significant, the release layer is composed of a quaternary metal alloy with peelability. The inventive ultra thin copper foil with the very low profile copper foil carrier shows low carrier bonding strength, not only having exceptional environment endurance, still exhibiting high temperature, moisture, acid, alkali resistances and other characteristics, the carrier foil and the ultra thin copper foil has excellent stripping properties even at the high temperature hot-pressurized environment.

3 Claims, 2 Drawing Sheets

ULTRA THIN COPPER FOIL WITH VERY LOW PROFILE COPPER FOIL AS CARRIER AND ITS MANUFACTURING METHOD

FIELD OF THE INVENTION

The present invention relates to an ultra thin copper foil with a "very low profile" (VLP) as a carrier, particularly to the composite comprising a carrier foil, a release layer (peelable layer) and an ultra thin copper foil used as fundamental materials for high-density and fine lines applications in the field of printed circuit boards, multi-layer printed circuit board, chip on film etc.

BACKGROUND OF THE INVENTION

The ultra thin copper foil with a carrier is used in the electronics industry as a high-density and fine line printed circuit board assembly, what to be emphasized today are supposed to light, thin, short and small, precision requirements for the circuit lines trend toward accuracy, and the demand of copper foil thinning processing is growing. The current ultra thin copper foil with a carrier generally is composed of an 18~35 μm thickness carrier (copper or aluminum foil), whereon an ultra thin copper foil of 1~6 μm thickness is electroplated.

With the high density requirement of various electronic components, the circuit board composites and circuit patterns thereof are also required to be high density, for example, as for printed circuit boards used in packaging, the track width and track spacing between the circuit lines are needed to be about 30 μm for the high density micro-circuits, the use of a thick electrodeposited copper foil will increase the etching time, the result will be that the vertical degree of the circuit pattern sidewall is destructed; a short circuit or a break circuit will not be formed in the wide line spacing circuit, but may happen in the narrow line spacing circuit.

The release layer between the carrier foil and the ultra thin copper foil is generally organic-based nitrogen containing organic compounds or inorganic-based chromium metal or chromate binary alloy inorganic film. The disadvantages of using the organic release film layer are not only the disposal treatments of the plating bath and wastewater which increase treatment costs and time, but also bubbles arise in the high temperature circuit board manufacturing process which affect the circuit board manufacturing quality and induce electricity test instability. On the other hand, the release film layer is composed of an inorganic based binary alloy, the ratio of its film thickness is the important factor to control the bonding strength of the ultra thin copper foil with the carrier foil, if the ratio control is poor, it is prone to peel incompletely or easy to peel so that the oxidation discoloration after lamination occurs.

The ultra thin copper foil used for a micro-thin circuit pattern is formed by electrolytic deposition directly on the release layer of the carrier foil, the best thickness of the ultra thin copper is below 5 μm. As the surface morphology of the carrier foil directly affects the release layer and the ultra thin copper foil, when the carrier surface roughness is higher, the subsequent electroplated ultra thin copper foil is also easy to have a high roughness, thereby the etching is affected. In addition, the uneven surface morphology of the carrier foil will also affect the thickness uniformity of the ultra thin copper foil for a time. At the same time when the carrier foil with pinholes, the ultra thin copper foil will also have pinholes. The carrier foil is the basis for the release layer and the ultra thin copper foil, therefore the choice of the carrier copper foil is very important. A traditional HTE (High Temperature Elongation) copper foil, or a rolled copper foil is used mainly as a carrier in former inventions, but the HTE copper foil is likely to have poor surface uniformity and pinhole problems. On the other hand, due to width and cost problems, the rolled copper foil will limit the application of products.

In addition, the laminating surface (mat) of the ultra thin foil is laminated with epoxy resin substrate, the laminating surface of the ultra thin foil undergoes a roughening treatment, anti-rust treatment and silane coating treatment and so on, all of them are closely related to adhesion to the substrate, which significantly affects the product qualities.

THE DETAILED DESCRIPTION OF THE INVENTION

To overcome the disadvantages of the existing ultra thin copper foil with a carrier, the inventors after many years of experience and research study have developed the ultra thin copper foil with a very low profile (VLP) copper foil as a carrier composed of a very low profile copper foil carrier, a quaternary alloy release layer and ultra-thin copper foil as shown in FIG. 1. The carrier layer is a Nan Ya Plastics Corporation supplied copper foil with a very low profile, having uniform morphology, smooth surface and pinhole-free characteristics. In the aspect of the release layer, the said release layer affects the bond strength between the carrier foil and the ultra thin copper foil to the maximum, the release layer is a quaternary alloy composed of molybdenum, nickel, chromium and potassium metals, which shows better antioxidant properties and etching properties than the binary alloy, meanwhile the carrier foil and the ultra thin copper foil still have excellent peeling properties even at the high temperature hot-pressurized environment, it is important characteristics of the present invention.

EXAMPLES

The purpose of this invention is to provide an ultra thin copper foil with a very low profile copper foil as a carrier, the said ultra thin copper foil has good antioxidant properties and etching characteristics, which still has excellent peelable characteristics even at the high temperature hot-pressurized environment and the carrier copper foil shows thickness uniformity and very few pinholes.

Generally the carrier foil for the ultra thin copper foil is a metal carrier foil, such as aluminum foil, copper foil, titanium foil and stainless steel foil, etc., all of the carrier foils are excellent surface smoothness metal foils with thickness 18~35 μm, whose gloss surface roughness values i.e. the average roughness Rz (unit μm) of 10 points are below 1.5 μm.

The inventive carrier layer as a foundation for the release layer and the ultra thin copper foil is a very low profile (VLP) copper foil, which is characterized by features of both sides glossy, low roughness, uniform thickness and no pinholes. The characteristics above are beneficial thereafter to the release layer and the ultra-thin copper foil. However, it is emphasized that based on the inventive superior release layer and the ultra thin copper foil layer formulations proposed later, no matter the type or the thickness of the carrier copper foil changes, the basic characteristics (such as peeling characteristics, etching characteristics and high temperature properties, etc.) of the inventive copper foil with the carrier do not have significant deterioration. However, if the high quality VLP copper foil is used, the overall characteristics of the ultra thin copper foil with the carrier copper foil will be raised.

The inventive release layer between the carrier foil and the ultra thin copper foil is an important plating layer which affects the bonding strength most, if the bonding strength of the release layer is too strong, it can not be stripped; if too weak, the carrier foil and the ultra thin copper foil are easily separated at the high-temperature hot-pressurized condition, resulting in oxidation discoloration problems of the ultra thin copper foil shiny surface, how to effectively control release layer uniformity and thickness is an important issue that must be overcome. In order to break through these deficiencies, the inventors have carried out a series of tests and discovered that when the release layer is composed of a quaternary alloy of molybdenum, nickel, chromium, potassium and so on with peelable characteristics, it can overcome these deficiencies and achieve the purpose of this invention.

The ultra thin copper foil of this invention is prepared firstly to use a copper pyrophosphate plating bath of PH=6~10, then use a copper sulfate plating bath of PH=1~12 to plate a metal carrier foil, i.e. at first plating copper pyrophosphate on the release layer to form a preventive layer to protect the release layer not to be washed off by the copper sulfate plating bath, not to affect the subsequent formation of the ultra thin copper foil and not to change the peeling strength. Then the ultra thin copper foil with 1~6 μm thickness is formed in the copper sulfate plating bath. To let Review Committee further understand the technical characteristics of the present invention, embodiments and examples are brought out to illustrate and support the invention content.

In accordance with the present invention, a carrier made of an excellent flatness copper foil is dipped into a plating bath containing nickel sulfate hexahydrate with a concentration of 10~50 g/L, sodium molybdate dihydrate with a concentration of 0.5~10 g/L, $K_4P_2O_7$: 50~100 g/L, $CrO_3$: 0.5~2 g/L to form a release layer, then the release layer is further plated with $Cu_2P_2O_7 \cdot 3H_2O$: 10~60 g/L, $K_4P_2O_7$: 100~400 g/L to acquire a protective layer, then dipped into an electrolyte plating bath with a copper concentration: 50~100 g/L, sulfuric acid: 90~125 g/L to gain an ultra thin copper foil with a thickness below 3 μm.

To get a stronger peeling strength between the ultra thin copper foil surface and the substrate, the inventive ultra thin copper foil surface has a rough treatment, and then the resulting rough surface is attached with zinc, nickel metals and chromate having anti-rust and heat resistance effects, further to enhance the peeling strength between the ultra thin copper foil with the substrate, and coated with silane to raise the peeling strength.

Example 1

1. The Nan Ya Plastics Corp's VLP copper foil having 18 μm thickness, glossy surface roughness below 1.5 μm, and very good flatness is used as a carrier foil.
2. The carry foil is dipped and electroplated in a quaternary alloy (molybdenum, nickel, chromium and potassium) plating bath containing nickel sulfate hexahydrate: 10~50 g/L, sodium molybdate dihydrate: 0.5~10 g/L, $K_4P_2O_7$: 50~100 g/L, $CrO_3$: 0.5~2 g/L, at PH: 6~10, bath temperature: 10~50° C., current density: 6~15 A/dm², power-on duration: 20 seconds to procure a peelable quaternary alloy layer consisting of molybdenum, nickel, chromium and potassium;
3. then the release layer is electroplated again under the conditions of $Cu_2P_2O_7 \cdot 3H_2O$: 10~60 g/L, $K_4P_2O_7$: 100~400 g/L, PH: 6~10, bath temperature: 10~60° C., current density: 1~5 A/d m², power-on duration: 15 seconds to secure a protective layer for the release layer.
4. thereafter the release surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, an ultra thin copper foil with a very low profile copper carrier is prepared, and a peeling test result shows that the carrier foil and the ultra thin copper foil can not be stripped off.

Example 2

1. The Nan Ya Plastics Corp's VLP copper foil having 18 μm thickness, glossy surface roughness below 1.5 μm, and very good flatness is used as a carrier foil.
2. The carry foil is dipped and electroplated in a quaternary alloy (molybdenum, nickel, chromium and potassium) plating bath containing nickel sulfate hexahydrate: 10~50 g/L, sodium molybdate dihydrate: 0.5~10 g/L, $K_4P_2O_7$: 50~100 g/L, $CrO_3$: 0.5~2 g/L, at PH: 6~10, bath temperature: 10~50° C., current density: 1~2.5 A/dm², power-on duration: 20 seconds to procure a release quaternary alloy layer consisting of molybdenum, nickel, chromium and potassium;
3. then the release layer is electroplated again under the conditions of $Cu_2P_2O_7 \cdot 3H_2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer.
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, an ultra thin copper foil with a very low profile copper carrier is prepared. After measurement, the carrier foil and the ultra thin copper foil almost no bonding strength.

Example 3

1. The Nan Ya Plastics Corp's VLP copper foil having 18 μm thickness, glossy surface roughness below 1.5 μm, and very good flatness is used as a carrier foil.
2. The carry foil is dipped and electroplated in a quaternary alloy (molybdenum, nickel, chromium and potassium) plating bath containing nickel sulfate hexahydrate: 10~50 g/L, sodium molybdate dihydrate: 0.5~10 g/L, $K_4P_2O_7$: 50~100 g/L, $CrO_3$: 0.5~2 g/L, at PH: 6~10, bath temperature: 10~50° C., current density: 2.5~6 A/dm², power-on duration: 20 seconds to procure a peelable quaternary alloy layer consisting of molybdenum, nickel, chromium and potassium;
3. then the release layer is electroplated again under the conditions of $Cu_2P_2O_7 \cdot 3H_2O$: 10~60 g/L, $K_4P_2O_7$: 100~400 g/L, PH: 6~10, bath temperature: 10~60° C., current density: 1~5 A/d m², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, thus an ultra thin copper foil with a very low profile copper carrier is prepared. The bonding strength value between the carrier foil and the ultra thin copper foil measured with a tensile tester made by Japan Shimadzu Corporation is 2.87 gf/cm.

Comparative Example 1

1. The Nan Ya Plastics Corp's VLP copper foil having 18 μm thickness, glossy surface roughness below 1.5 μm, and very good flatness is used as a carrier foil.
2. The carry foil is dipped and electroplated in a ternary alloy—molybdenum, nickel and potassium plating bath containing nickel sulfate hexahydrate: 10~50 g/L, sodium molybdate dihydrate: 0.5~10 g/L, $K_4P_2O_7$: 50~100 g/L, at PH: 6~10, bath temperature: 10~50° C., current density: 2.5~6 A/dm², power-on duration: 20 seconds to procure a peelable ternary alloy layer consisting of molybdenum, nickel and potassium;
3. then the release layer is electroplated again under the conditions of $Cu_2P_2O_7.3H2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, thus an ultra thin copper foil with a very low profile copper carrier is prepared. The bonding strength value between the carrier foil and the ultra thin copper foil measured with a tensile tester made by Japan Shimadzu Corporation is 5.40 gf/cm.

Comparative Example 2

1. The Nan Ya Plastics Corp's VLP copper foil having 18 μm thickness, glossy surface roughness below 1.5 μm, and very good flatness is used as a carrier foil.
2. The carry foil is dipped and electroplated in a ternary alloy (molybdenum, potassium and chromium) plating bath containing sodium molybdate dihydrate: 0.5~10 g/L, $K_4P_2O_7$: 50~100 g/L, 50~100 g/L, $CrO_3$ PH: 6~10, at bath temperature: 10~50° C., current density: 2.5~6 A/dm², power-on duration: 20 seconds to procure a peelable ternary alloy layer consisting of molybdenum, potassium and chromium;
3. then the release layer is electroplated again under the conditions of $Cu_2P_2O_7.3H2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, an ultra thin copper foil with a very low profile copper carrier is prepared, and a peeling test result shows that the carrier foil and the ultra thin copper foil, can not be stripped off.

Comparative Example 3

1. The Nan Ya Plastics Corp's VLP copper foil having 18 μm thickness, glossy surface roughness below 1.5 μm, and very good flatness is used as a carrier foil.
2. The carry foil is dipped and electroplated in a ternary alloy (nickel, potassium and chromium) plating bath containing nickel sulfate hexahydrate: 10~50 g/L, $K_4P_2O_7$: 50~100 g/L, $CrO_3$: 0.5~2 g/L, at PH: 6~10, bath temperature: 10~50° C., current density: 2.5~6 A/dm², power-on duration: 20 seconds to procure a peelable ternary alloy layer consisting of nickel potassium and chromium;
3. then the release layer is electroplated again under the conditions of $Cu_2P_2O_7.3H2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, an ultra thin copper foil with a very low profile copper carrier is prepared, and a peeling test result shows that the carrier foil and the ultra thin copper foil, can not be stripped off.

Comparative Example 4

1. The Nan Ya Plastics Corp's VLP copper foil having 18 μm thickness, glossy surface roughness below 1.5 μm, and very good flatness is used as a carrier foil.
2. The carry foil is dipped and electroplated in a ternary alloy (molybdenum, nickel and chromium) plating bath containing nickel sulfate hexahydrate: 10~50 g/L, sodium molybdate dihydrate: 0.5~10 g/L, $CrO_3$: 0.5~2 g/L, at, PH: 6~10, bath temperature: 10~50° C., current density: 2.5~6 A/dm², power-on duration: 20 seconds to procure a peelable ternary alloy layer consisting of molybdenum, nickel and chromium;
3. then the release layer is electroplated again under the conditions of $Cu_2P_2O_7.3H2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, thus an ultra thin copper foil with a very low profile copper carrier is prepared. The bonding strength value between the carrier foil and the ultra thin copper foil measured with a tensile tester made by Japan Shimadzu Corporation is 11.45 gf/cm.

Comparative Example 5

1. The Nan Ya Plastics Corp's VLP copper foil having 18 μm thickness, glossy surface roughness below 1.5 μm, and very good flatness is used as a carrier foil.
2. The carry foil is dipped and electroplated in a quaternary alloy (nickel, molybdenum, chromium and sodium) plating bath containing nickel sulfate hexahydrate: 10~50 g/L, sodium molybdate dihydrate: 0.5~10 g/L, $CrO_3$: 0.5~2 g/L, sodium citrate: 100~350 g/L, at PH: 6~10, bath temperature: 10~50° C., current density: 2.5~6 A/dm², power-on duration: 20 seconds to procure a peelable quaternary alloy layer consisting of nickel, molybdenum, chromium and sodium;
3. then the release layer is electroplated again under the conditions of $Cu_2P_2O_7.3H_2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, an ultra thin copper foil with a very low profile copper carrier is prepared, and a peeling test result shows that the carrier foil and the ultra thin copper foil, can not be stripped off.

Comparative Example 6

1. The Nan Ya Plastics Corp's VLP copper foil having 18 μm thickness, glossy surface roughness below 1.5 μm, and very good flatness is used as a carrier foil.
2. The carry foil is dipped and electroplated in a ternary alloy (molybdenum, nickel, chromium and potassium) plating bath containing sodium molybdate dihydrate: 0.5~10 g/L, $K_4P_2O_7$: 50~100 g/L, 50~100 g/L, $CrO_3$ PH: 6~10, at bath temperature: 10~50° C., current density: 2.5~6 A/dm², power-on duration: 20 seconds to procure a peelable ternary alloy layer consisting of molybdenum, nickel, chromium and potassium;
3. then the release layer is electroplated again under the conditions of $Cu_2P_2O_7.3H2O$: 10~60 g/L, $K_4P_2O_7$: 100~400 g/L, PH: 6~10, bath temperature: 10~60° C., current density: 1~5 A/dm², power-on duration: 15 seconds to secure a protective layer for the release layer;
4. thereafter the peelable surface is electroplated again under the conditions of copper concentration: 50~100 g/L, sulfuric acid: 90~125 g/L, bath temperature: 40~70° C., current density: 25 A/dm², power-on duration: 20 seconds to obtain an ultra thin copper foil of 3 μm thickness;
5. finally the resulted lamination surface is mated to produce a dull surface via a copper particles treatment known in arts, then to impose anti-rust procession with zinc and chromate treatment and silane coating, thus an ultra thin copper foil with an ultra low profile copper carrier is prepared. The bonding strength value between the carrier foil and the ultra thin copper foil measured with a tensile tester made by Japan Shimadzu Corporation is 10.8 gf/cm.

TABLE 1

The Relationship between release Layer Formation Metals and Carrier Bonding Strength

| Items | Carrier | Release Layer Formation Metals | | | | Carrier Bonding Strength (RT, gf/cm) | Pinholes |
|---|---|---|---|---|---|---|---|
| | | 1 | 2 | 3 | 4 | | |
| Example 1 | VLP | chromium | molybdenum | nickel | potassium | can not be stripped off | — |
| Example 2 | VLP | chromium | molybdenum | nickel | potassium | almost no bonding strength | — |
| Example 3 | VLP | chromium | molybdenum | nickel | potassium | 2.87 | 0 |
| Comparative Example 1 | VLP | — | molybdenum | nickel | potassium | 5.4 | 2 |
| Comparative Example 2 | VLP | chromium | molybdenum | — | potassium | can not be stripped off | — |
| Comparative Example 3 | VLP | chromium | — | nickel | potassium | can not be stripped off | — |
| Comparative Example 4 | VLP | chromium | molybdenum | nickel | — | 11.45 | 3 |
| Comparative Example 5 | VLP | chromium | molybdenum | nickel | sodium | can not be stripped off | — |
| Comparative Example 6 | HTE (High Temperature Elongation) | chromium | molybdenum | nickel | potassium | 10.8 | 5 |

Based on the above-mentioned examples, comparative examples and Table 1, increasing the quaternary alloy plating current density in Example 1 causes so strong carrier adhesion that it can not be stripped off. Conversely, if the quaternary alloy electroplating current density is lower, the carrier bonding strength will be so weak that almost no bonding strength between the ultra thin copper foil and carrier foil, such as Example 2. In Comparative Example 1, the carrier bonding strength of the ultra thin copper foil with an very low profile copper foil as the carrier is 5.40 gf/cm, which is very close to 2.87 gf/cm in Example 3, shows no problem in peeling between the ultra thin copper foil and the carrier foil, but in Comparative Example 1, the anti-oxidation capability of the ultra thin copper foil shiny side is deficient to show a slight oxidation.

In Comparative Example 4, the carrier bonding strength of the ultra thin copper foil with a very low profile copper foil as a carrier is higher, thus there is no peeling problem between the carrier foil and the ultra thin copper foil, but there is muddy precipitation phenomenon in the quaternary alloy plating bath, the plating bath management and the waste water disposal will increase a lot of processing time and costs. The release layer forming metals of Comparative Examples 1 and 4 though both have peelable characteristics, but the shortcomings of insufficient antioxidant capabilities and the plating bath muddy precipitation mean that they are not the best choice.

All release layer forming metals of Comparative Examples 2, 3 and 5 show too strong carrier bonding strengths, thus these release layers can not be stripped off smoothly from the ultra thin copper foil. The inventive quaternary ultra thin copper foil with an very low profile copper foil as the carrier shows a low binding force with the carrier, there is no peeling problem between the carrier foil and the ultra thin copper foil, as compared to Comparative Example 4, the quaternary alloy release layer used in the inventive examples shows low carrier bonding strength, better processability, and no bath turbidity precipitation and wastewater disposal problems, so any metal in the formation of the quaternary alloy is dispensable. In the present invention, the bonding strength between the ultra thin copper foil and the very low profile copper foil carrier is low, the quaternary alloy combination in the formation of the release layer is not found in the previous arts, thus it is a novel pioneering technology.

In the inventive Examples, the ultra thin copper foil with a very low profile copper foil as the carrier shows superior environmental endurance, low carrier peeling strength, outstanding resistances to high temperature, moisture, acid, alkali and other characteristics, further more an excellent peelability between the carrier foil and the ultra thin copper foil exhibits even at the high temperature hot-pressurized environment, for example, the resin substrate is high temperature hot-laminated, after lamination, the carrier foil is peeled off to observe the ultra thin copper foil shiny surface without oxidation discoloration, which means quite excellent tolerance to the environment; the room temperature bonding strengths are also quite outstanding as shown in Table 1; after hot-lamination with various substrates with high glass transition temperatures, the binding force between the carrier foil and the ultra thin copper foil is also quite excellent, as shown Table 2 and FIG. 3, it is perceived that the bonding strength between the carrier and the ultra thin copper foil is very good.

TABLE 2

The bonding strength of the carrier foil and the ultra thin copper foil applied to different substrates

| Substrates | BT (gf/cm) | NPG180IA (gf/cm) | NP180 (gf/cm) |
|---|---|---|---|
| Bonding Strength | 11.96 | 4.61 | 12.89 |

Notes:
BT = Mitsubishi Gas Company's resin, Bismelaimide Triazene resin, trade name BT
NPG180IA = Nan Ya Plastics Corp.'s halogen-free resin, glass transition temperature (Tg) 180° C., trade names NPG180IA.
NP180 = Nan Ya Plastics Corp.'s halogen resin, glass transition temperature (Tg) 180° C., trade names NP180.

The inventive ultra thin copper foil with the very low profile copper foil as the carrier exhibits in addition to excellent peeling characteristics and tolerance to the environment, the etching characteristic is quite excellent, after etching, the circuit pattern sidewall shows good verticality, the lower edge of the circuit pattern sidewall has no residue, thus no short circuit or break problems. This feature helps the electrical reliability and the quality stability of printed circuit boards. See FIG. 2.

THE DESCRIPTION OF MAIN ELEMENTS

Figure 1:
FIG. 1 The picture shows the copper foil construction
FIG. 2 The picture shows the etching circuit pattern
FIG. 3 The picture shows the bonding strength of the carrier foil and the ultra thin copper foil applied to different substrates
Figure 2:
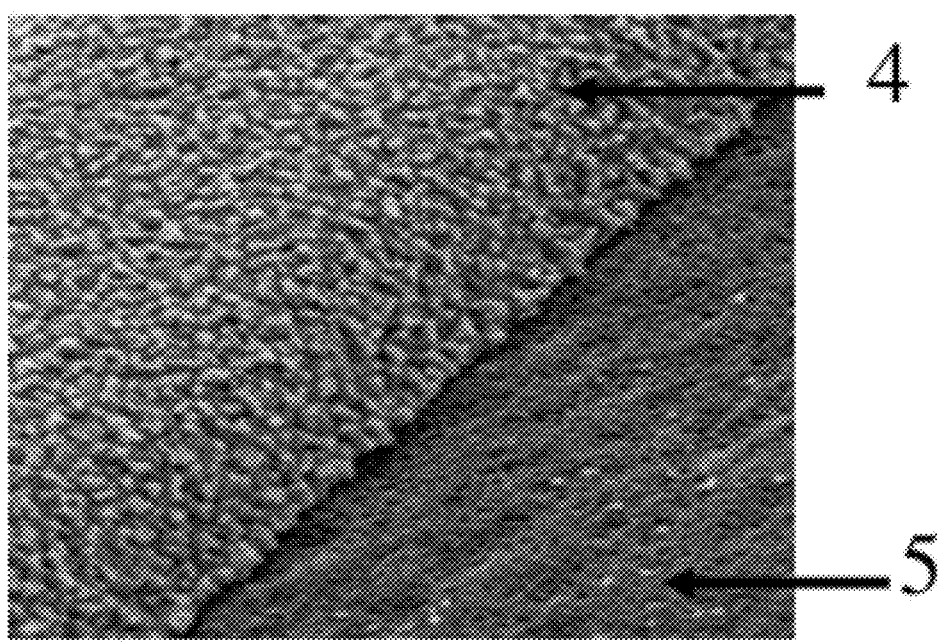
Figure 3:
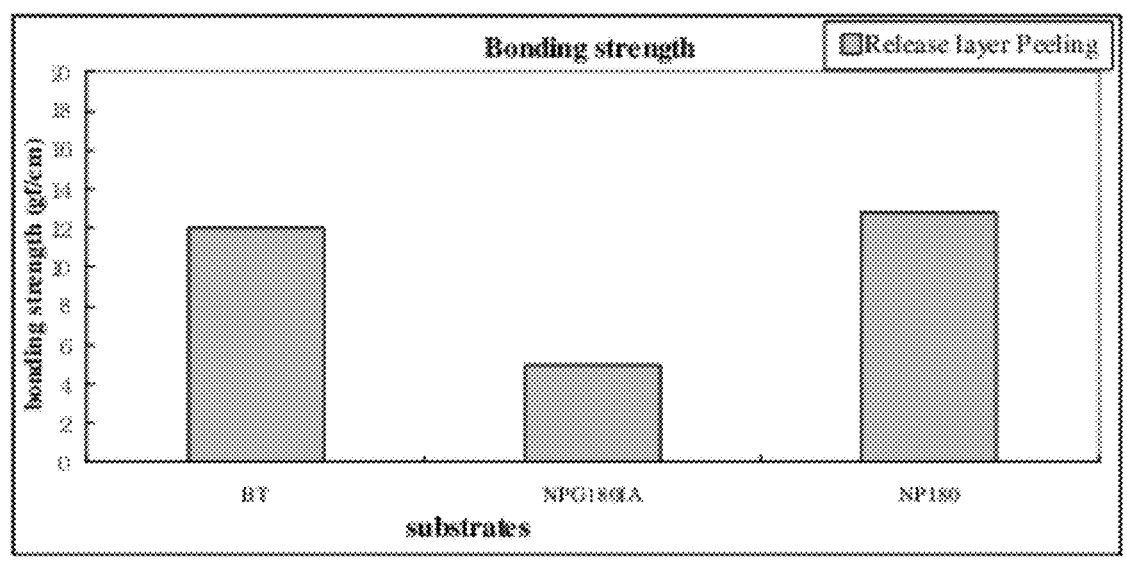

1. Ultra thin copper foil
2. Release layer
3. Carrier foil
4. Etching circuit pattern
5. Etching substrate morphology

What we claimed is:

1. An ultra thin copper foil with a very low profile copper foil as a carrier consists of the carrier foil, release layer, and the ultra thin copper foil composed by electroplating; characterized in that:
   (1) the carrier layer is a copper foil with a very low profile, whose two sides are bright and smooth with a thickness of 12-70 μm;
   (2) the release layer is prepared by electroplating a quaternary alloy bath comprising molybdenum, nickel, chromium and potassium on the carrier foil to form a plating layer with 1-6 μm thickness, and the release layer is made from a quaternary alloy consisting molybdenum, nickel, chromium and potassium or the metal mixture thereof;
   (3) the preparation of the ultra thin copper foil includes firstly to plate a protection layer on the release layer under the conditions of $Cu_2P_2O_7 \cdot 3H_2O$: 10-60 g/L, $K_4P_2O_7$: 100-400 g/L, PH: 6-10, bath temperature: 10-60° C., current density: 1-5 A/dm$^2$, power-on time: 15 seconds; then whereon to plate an ultra thin copper foil with a thickness of 1-6 μm under the conditions of copper concentration: 50-100 g/L, sulfuric acid: 90-125 g/L, bath Temperature: 40-70° C., current density: 10-50 A/dm$^2$, power-on duration: 20 seconds.

2. The ultra thin copper foil with the very low profile copper foil as the carrier as claimed in claim 1, wherein the carrier layer is a 12-70 μm thick copper foil with the very low profile.

3. The ultra thin copper foil with the very low profile copper foil as the carrier as claimed in claim 1, which can be used in printed circuit boards with high-density super fine circuits, multilayer printed circuit boards, chip on film (COF) resin substrates, polyimide film and so on.

* * * * *